(12) United States Patent
Nihei

(10) Patent No.: US 7,732,984 B2
(45) Date of Patent: Jun. 8, 2010

(54) PIEZOELECTRIC ACTUATOR, METHOD OF MANUFACTURING PIEZOELECTRIC ACTUATOR, AND LIQUID EJECTION HEAD

(75) Inventor: Yasukazu Nihei, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 369 days.

(21) Appl. No.: 11/472,391

(22) Filed: Jun. 22, 2006

(65) Prior Publication Data
US 2007/0063615 A1 Mar. 22, 2007

(30) Foreign Application Priority Data
Jun. 24, 2005 (JP) .............................. 2005-185169

(51) Int. Cl.
*H01L 41/08* (2006.01)
(52) U.S. Cl. ...................... 310/324; 310/331
(58) Field of Classification Search ............... 310/324, 310/334, 328, 346, 345, 348
See application file for complete search history.

(56) References Cited

U.S. PATENT DOCUMENTS

| | | | | |
|---|---|---|---|---|
| 4,047,060 A | * | 9/1977 | Schafft | 310/322 |
| 5,469,012 A | * | 11/1995 | Suzuki et al. | 310/348 |
| 5,664,456 A | * | 9/1997 | Eckert | 73/290 V |
| 6,153,967 A | * | 11/2000 | Kobayashi et al. | 310/334 |
| 6,606,772 B1 | * | 8/2003 | Nohara et al. | 29/25.35 |
| 6,872,433 B2 | * | 3/2005 | Seward et al. | 428/36.9 |
| 7,091,650 B2 | * | 8/2006 | Xu et al. | 310/330 |
| 7,186,296 B2 | * | 3/2007 | Sasaki | 118/665 |
| 7,259,503 B2 | * | 8/2007 | Pei et al. | 310/363 |

OTHER PUBLICATIONS

T. Yoshimura et al., Piezoelectric Properties of Ferroelectric Epitaxial Films with High Curie Temperature, Transactions on Sensors and Micromachines, Apr. 2004, pp. 117-123, vol. 124E-No. 4, Institute of Electrical Engineers of Japan.

* cited by examiner

*Primary Examiner*—Mark Budd
(74) *Attorney, Agent, or Firm*—Birch, Stewart, Kolasch & Birch, LLP

(57) ABSTRACT

The piezoelectric actuator comprises: a substrate; a constraint force buffering layer which is formed on the substrate and made of a hardness control material having low hardness; and a piezoelectric element which is formed directly on the constraint force buffering layer.

17 Claims, 6 Drawing Sheets

FIG.4A
FORMATION OF DIAPHRAGM

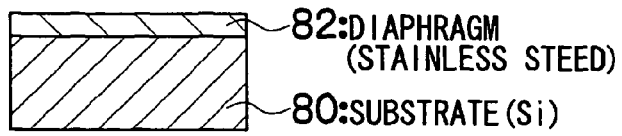

82: DIAPHRAGM (STAINLESS STEED)
80: SUBSTRATE (Si)

FIG.4B
FORMATION OF LOWER ELECTRODE

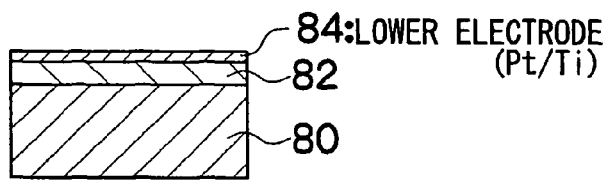

84: LOWER ELECTRODE (Pt/Ti)
82
80

FIG.4C
FORMATION OF CONSTRAINT FORCE BUFFERING LAYER

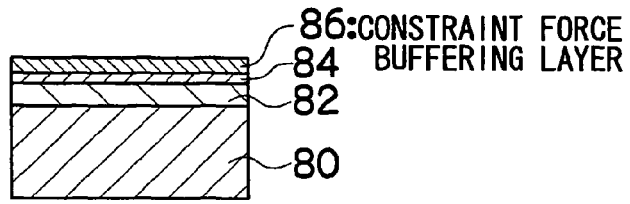

86: CONSTRAINT FORCE BUFFERING LAYER
84
82
80

FIG.4D
FORMATION OF PIEZOELECTRIC FILM

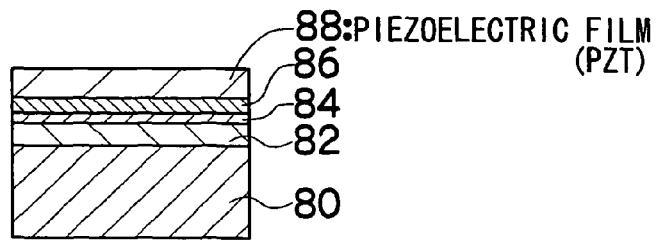

88: PIEZOELECTRIC FILM (PZT)
86
84
82
80

FIG.4E
FORMATION OF UPPER ELECTRODE

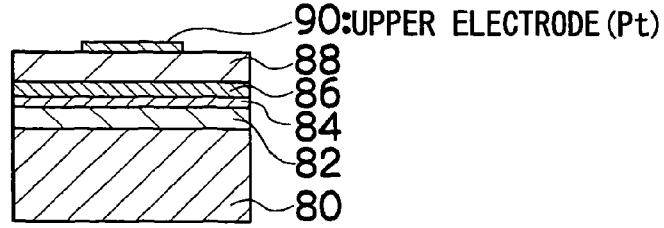

90: UPPER ELECTRODE (Pt)
88
86
84
82
80

FIG.4F
FORMATION OF PRESSURE CHAMBER PARTITIONS

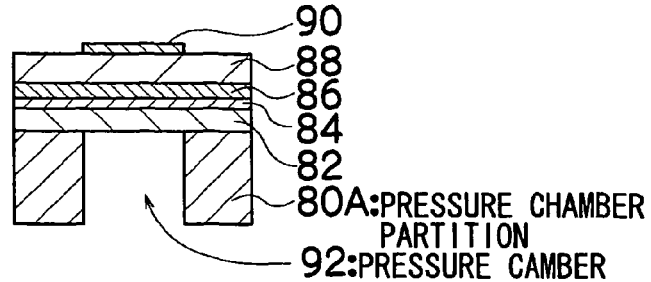

90
88
86
84
82
80A: PRESSURE CHAMBER PARTITION
92: PRESSURE CAMBER

FIG.4G
FORMATION OF NOZZLE PLATE

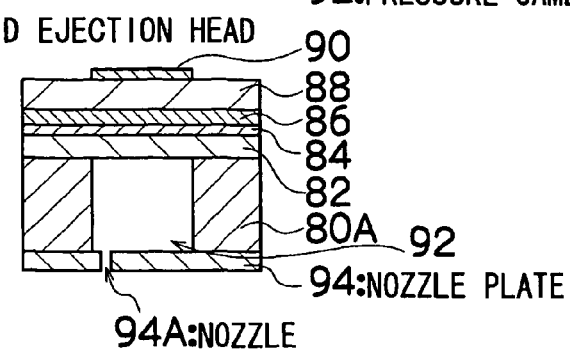

96: LIQUID EJECTION HEAD
90
88
86
84
82
80A  92
94: NOZZLE PLATE
94A: NOZZLE

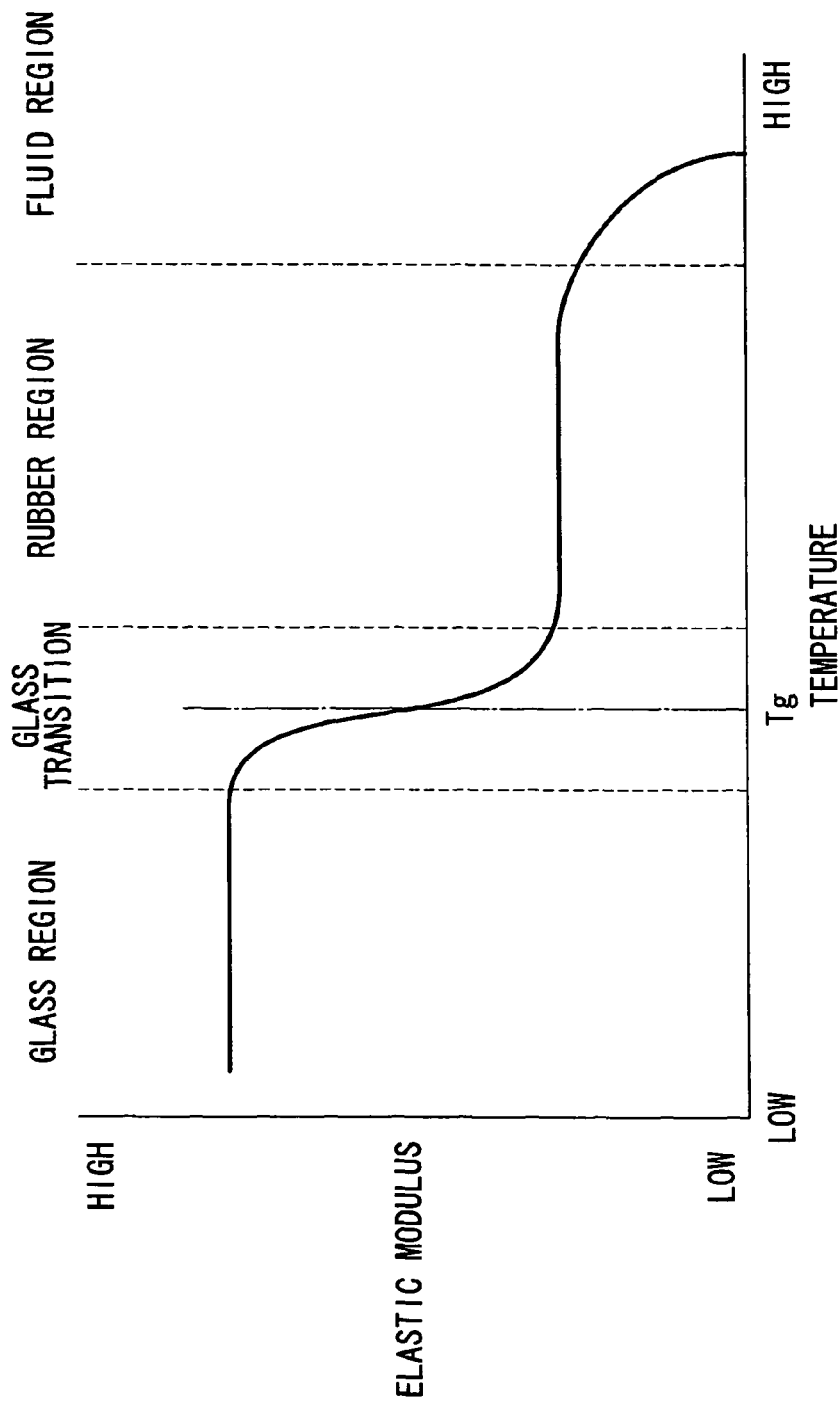

FIG.6A
FORMATION OF DIAPHRAGM FROM HARDNESS CONTROL MATERIAL

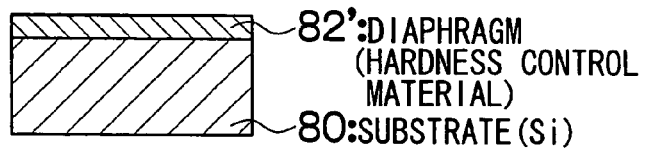

82':DIAPHRAGM (HARDNESS CONTROL MATERIAL)
80:SUBSTRATE(Si)

FIG.6B
FORMATION OF LOWER ELECTRODE

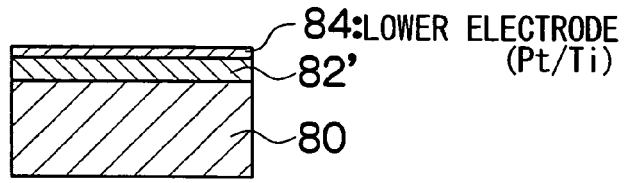

84:LOWER ELECTRODE (Pt/Ti)
82'
80

FIG.6C
FORMATION OF PIEZOELECTRIC FILM

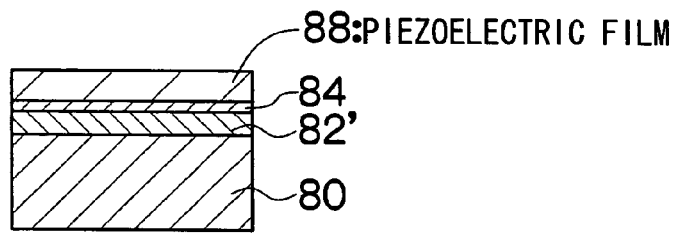

88:PIEZOELECTRIC FILM
84
82'
80

FIG.6D
FORMATION OF UPPER ELECTRODE

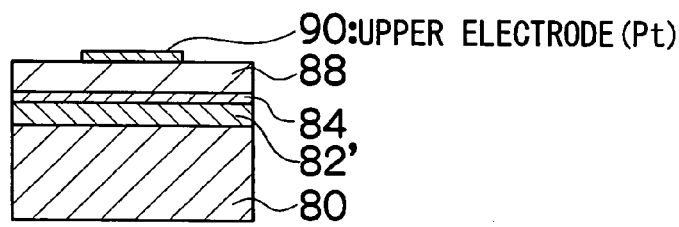

90:UPPER ELECTRODE (Pt)
88
84
82'
80

FIG.6E
FORMATION OF PRESSURE CHAMBER PARTITION

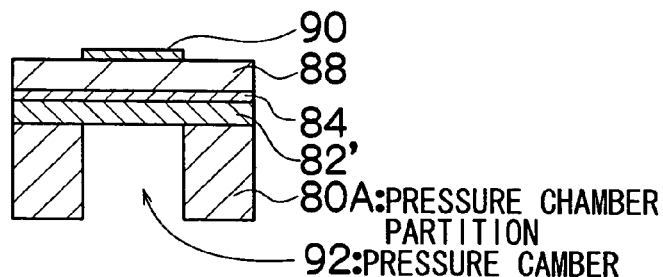

90
88
84
82'
80A:PRESSURE CHAMBER PARTITION
92:PRESSURE CAMBER

FIG.6F
FORMATION OF NOZZLE PLATE

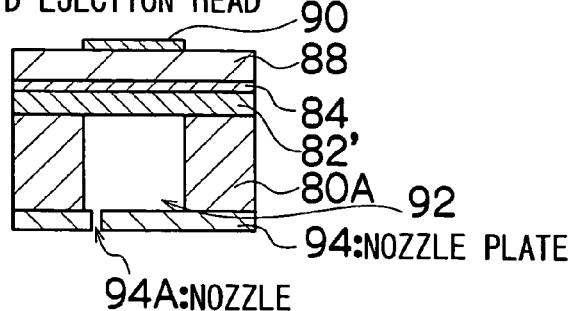

96':LIQUID EJECTION HEAD
90
88
84
82'
80A
92
94:NOZZLE PLATE
94A:NOZZLE

PIEZOELECTRIC ACTUATOR, METHOD OF MANUFACTURING PIEZOELECTRIC ACTUATOR, AND LIQUID EJECTION HEAD

BACKGROUND OF THE INVENTION

1. Field of the Invention

The present invention relates to a piezoelectric actuator, a method of manufacturing a piezoelectric actuator, and a liquid ejection head, and more particularly to technology for raising piezoelectric properties.

2. Description of the Related Art

Piezoelectric actuators using piezoelectric elements have been developed. It has been reported that, in a piezoelectric actuator of this kind, since a film of piezoelectric material (piezoelectric film) is formed directly on top of a substrate, the displacement of the piezoelectric film in the direction along the film surface is constrained (in the following description, this is also called "substrate constraint") and the piezoelectric properties decline accordingly (see "Piezoelectric Properties of Ferroelectric Epitaxial Films with High Curie temperature" by Takeshi Yoshimura and Susan Trolier-McKinstry, IEEJ (Institute of Electrical Engineers of Japan) Transactions on Sensors and Micromachines, April 2004 Volume 124-E Number 4, pp. 117-123). This paper discloses technology in which, by using a film having high piezoelectric properties due to epitaxial growth of the piezoelectric elements, decline in the piezoelectric properties caused by the substrate constraint, or the like, is counteracted. Although this paper discloses technology which raises the piezoelectric properties of the piezoelectric film itself, it does not disclose technology which reduces the effects of the substrate constraint on the piezoelectric film. More specifically, it is not sufficient to resolve the decline in d31 properties caused by the fact that the displacement created by expansion and contraction of the piezoelectric film along the film surface direction is restricted by the substrate constraint.

SUMMARY OF THE INVENTION

The present invention has been contrived in view of the aforementioned circumstances, an object thereof being to provide a piezoelectric actuator capable of improving the d31 properties of a piezoelectric element, a method of manufacturing such a piezoelectric actuator, and a liquid ejection head comprising such a piezoelectric actuator.

In order to attain the aforementioned object, the present invention is directed to a piezoelectric actuator, comprising: a substrate; a constraint force buffering layer which is formed on the substrate and made of a hardness control material having low hardness; and a piezoelectric element which is formed directly on the constraint force buffering layer.

According to this aspect of the invention, a constraint force buffering layer of low hardness is provided, and thereby it is possible to reduce the constraint force of the substrate constraint whereby the substrate restricts the piezoelectric element in a film surface direction. Therefore, it is possible to improve the d31 characteristics of the piezoelectric element. The hardness of the hardness control material may change in accordance with temperature condition. The hardness of the hardness control material may include at least a rubber region and a glass region in accordance with temperature condition. In the rubber region, the hardness control material has relatively low hardness (relatively a low elastic modulus). In the glass region, the hardness control material has relatively high hardness (relatively a high elastic modulus).

In order to attain the aforementioned object, the present invention is also directed to a piezoelectric actuator, comprising: a substrate which is made of a hardness control material having low hardness; and a piezoelectric element which is formed directly on the substrate.

According to this aspect of the invention, it is possible to reduce the constraint force caused by the substrate constraint, by forming the substrate from a material having low hardness. Therefore, it is possible to improve the d31 characteristics of the piezoelectric element.

Preferably, Vickers hardness of the hardness control material is not greater than approximately 400 Hv.

According to this aspect of the invention, the Vickers hardness of the hardness control material is limited to approximately 400 Hv or below. The Vickers hardness of the hardness control material may be limited to approximately 400 Hv or below in the rubber region.

Preferably, the piezoelectric element is formed by a deposition method.

According to these aspects of the invention, the formation method of the piezoelectric element is limited.

Preferably, the hardness control material has a high hardness under a temperature condition during formation of the piezoelectric element.

If the piezoelectric element is formed by a deposition method, then the surface on which the piezoelectric element is to be formed is required to have a certain level of strength. According to this aspect of the invention, since the surface on which the piezoelectric element is formed has a high hardness under the temperature condition during formation of the piezoelectric element, then it is possible to form the piezoelectric element by a deposition method. Under the temperature condition during formation of the piezoelectric element, the hardness of the hardness control material may belong to the glass region.

Preferably, Vickers hardness of the hardness control material under the temperature condition during formation of the piezoelectric element is not lower than approximately 400 Hv.

According to this aspect of the invention, the hardness of the hardness control material during the formation of the piezoelectric element is limited. The Vickers hardness of the hardness control material may be limited to approximately 400 Hv or above in the glass region. Desirably, the Vickers hardness of the hardness control material is limited to more than approximately 400 Hv.

Preferably, the hardness control material is at least one of a resin material, a shape memory polymer and a polyurethane-type shape memory polymer.

According to this aspect of the invention, the types of the hardness control material are limited.

Preferably, the hardness control material is a shape memory polymer of which a glass transition temperature is not greater than a temperature during driving of the piezoelectric actuator.

According to this aspect of the invention, since the constraint force buffering layer changes from the glass transition region to the rubber region under the temperature condition during driving, then it is possible to reduce the constraint force caused by the substrate constraint. Moreover, by setting the temperature during formation of the piezoelectric element to be equal to or lower than the glass transition point (the glass transition temperature), then it is possible to form the piezoelectric element by means of a deposition method. Desirably, the glass transition temperature of the shape memory polymer is not greater than a temperature of the shape memory polymer during driving of the piezoelectric actuator.

In order to attain the aforementioned object, the present invention is also directed to a liquid ejection head comprising any one of the piezoelectric actuators described above.

According to this aspect of the invention, the d31 properties are improved by one of the piezoelectric actuators described above.

In order to attain the aforementioned object, the present invention is also directed to a method of manufacturing a piezoelectric actuator, comprising the steps of: forming a constraint force buffering layer on a substrate, the constraint force buffering layer being made of a hardness control material of which hardness changes in accordance with temperature condition; raising the hardness of the constraint force buffering layer by cooling or heating the constraint force buffering layer; and forming a piezoelectric element by a deposition method, on the constraint force buffering layer of which hardness has been raised.

According to this aspect of the invention, since the hardness of the constraint force buffering layer can be raised by controlling the temperature during the formation of the piezoelectric element, it is possible to form the piezoelectric element by means of a deposition method. The hardness of the constraint force buffering layer whose hardness has been raised may belong to the glass region.

In order to attain the aforementioned object, the present invention is also directed to a method of manufacturing a piezoelectric actuator, comprising the steps of: making a substrate of a hardness control material of which hardness changes in accordance with temperature condition; raising the hardness of the substrate by cooling or heating the substrate; and forming a piezoelectric element by a deposition method, on the substrate of which hardness has been raised.

According to this aspect of the invention, since the hardness of the substrate can be raised by controlling the temperature during the formation of the piezoelectric element, it is possible to form the piezoelectric element by means of a deposition method. The hardness of the constraint force buffering layer whose hardness has been raised may belong to the glass region.

Moreover, in a piezoelectric actuator manufactured by the above methods of manufacturing a piezoelectric actuator, decline in the d31 properties due to substrate constraint can be prevented by lowering the hardness of the constraint force buffering layer during driving.

According to a method of manufacturing a piezoelectric actuator on the basis of the present invention, during the forming of the piezoelectric element, it is possible to raise the hardness of the constraint force buffering layer or the substrate made of a hardness control material, and therefore the piezoelectric element can be formed by a deposition method. Moreover, according to a piezoelectric actuator on the basis of the present invention, by reducing the hardness of the constraint force buffering layer or the substrate during driving, it is possible to reduce the constraint force of substrate constraint in which the substrate restricts the piezoelectric element in the film surface direction. Therefore, it is possible to improve the d31 characteristics of the piezoelectric element.

BRIEF DESCRIPTION OF THE DRAWINGS

The nature of this invention, as well as other objects and benefits thereof, are explained in the following with reference to the accompanying drawings, in which like reference characters designate the same or similar parts throughout the figures and wherein:

FIGS. 4A to 4G are diagrams showing a method of manufacturing a liquid ejection head according to a first embodiment of the present invention;

FIG. 5 is a graph showing a schematic view of temperature dependence properties of the elastic modulus of the shape memory polymer; and FIGS. 6A to 6F are diagrams showing a method of manufacturing a liquid ejection head according to a second embodiment of the present invention.

DETAILED DESCRIPTION OF THE PREFERRED EMBODIMENTS

Figure 1:
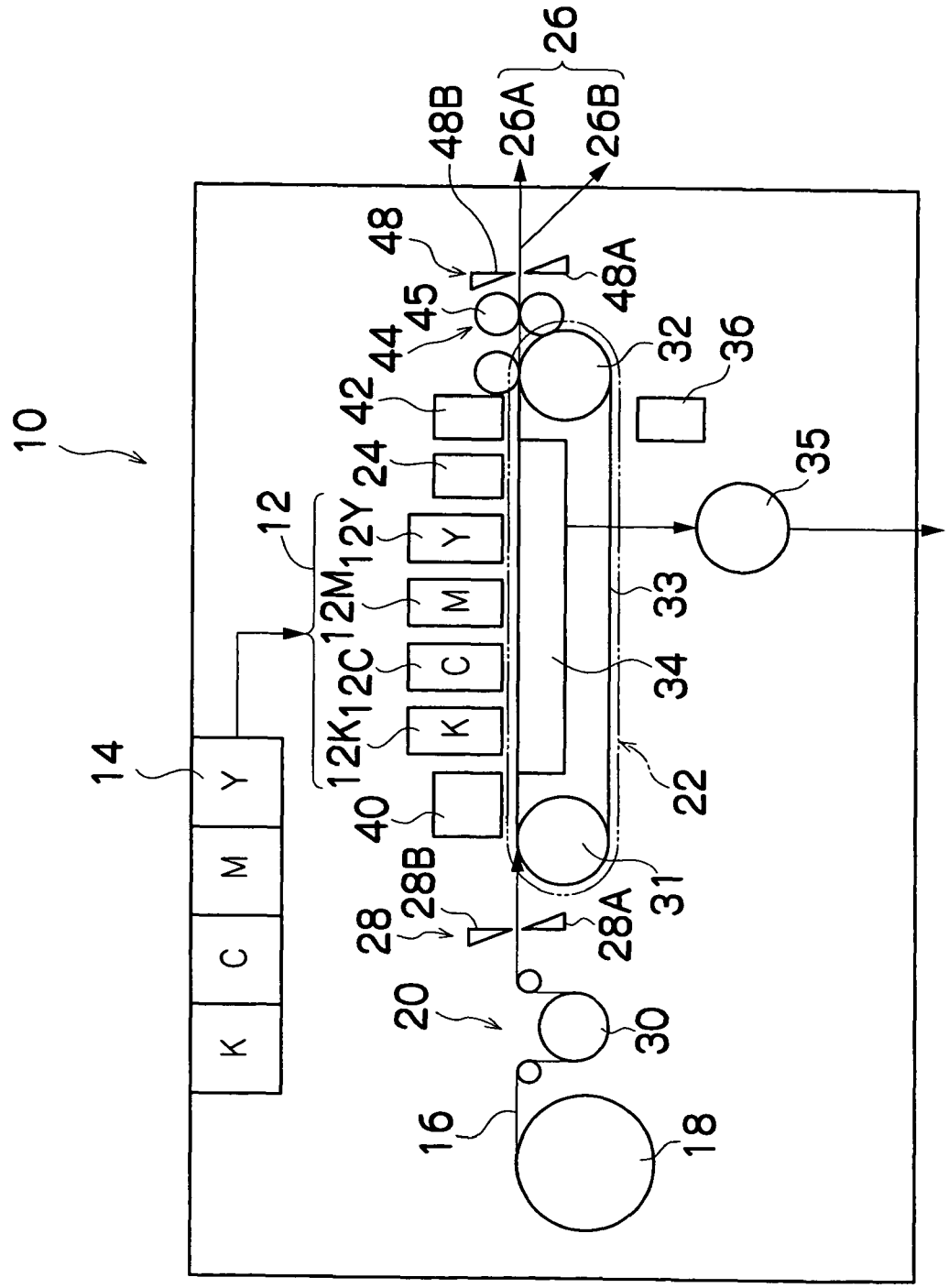
FIG. 1 is a general schematic drawing of an inkjet recording apparatus.

Firstly, an inkjet recording apparatus to which the liquid ejection head according to an embodiment of the present invention is applied is described below with reference to FIGS. 1 and 2. FIG. 1 is a general schematic drawing of an inkjet recording apparatus;

As shown in FIG. 1, the inkjet recording apparatus 10 comprises: a print unit 12 having a plurality of liquid ejection heads (hereinafter, simply also called "heads") 12K, 12C, 12M, and 12Y for ink colors, respectively; an ink storing and loading unit 14 for storing inks to be supplied to the print heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink droplet ejection face) of the print unit 12, for conveying the recording paper 16 while keeping the recording paper 16 flat; a print determination unit 24 for reading the printed result produced by the print unit 12; and a paper output unit 26 for outputting printed recording paper (printed matter) to the exterior.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite to the direction of the curl caused by the magazine.

Since roll paper is used as the recording paper 16, the inkjet recording apparatus shown in FIG. 1 is provided with a cutter (first cutter) 28. The roll paper (recording paper 16) is cut to a prescribed size by means of this cutter 28. The cutter 28 according to the present embodiment comprises a stationary blade 28A having a length equal to or exceeding the width of the conveyance path of the recording paper 16, and a circular blade 28B which moves along the stationary blade 28A. The stationary blade 28A is provided on the rear side of the print surface of the recording paper 16, and the circular blade 28B is disposed on the print surface side, across the conveyance path from the stationary blade 28A. If cut paper is used as the recording paper 16, then the cutter 28 is not necessary.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a horizontal plane (flat plane).

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1. The suction chamber 34 provides suction with a fan 35 to generate a negative pressure, and the recording paper 16 on the belt 33 is held by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt cleaning unit 36 is disposed in a predetermined position (a suitable position outside the printing area) on the exterior side of the belt 33.

A heating fan 40 is disposed before the printing unit 12 in the medium conveyance pathway formed by the suction belt conveyance unit 22. The heating fan 40 blows heated air onto the recording paper 16 to heat the recording paper 16 immediately before printing so that the ink deposited on the recording paper 16 dries more easily.

Figure 2:
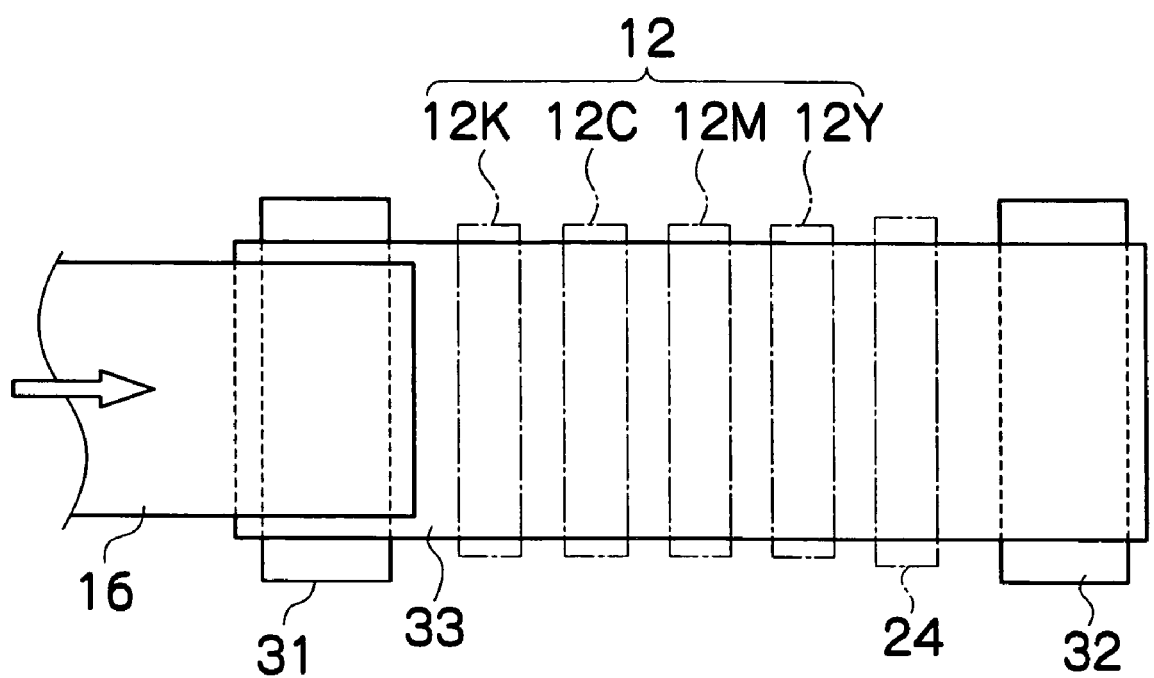
FIG. 2 is a plan diagram showing the main composition of the peripheral area of a print unit of an inkjet recording apparatus.

The print unit 12 is a so-called "full line head" type in which a line head having a length corresponding to the maximum paper width is arranged in a direction (main scanning direction) that is perpendicular to the paper feed direction (see FIG. 2). As shown in FIG. 2, the print heads 12K, 12C, 12M and 12Y are constituted by line heads in which a plurality of ink ejection ports (nozzles) are arranged in the through a length exceeding at least one side of the maximum size recording paper 16 intended for use with the inkjet recording apparatus 10.

The heads 12K, 12C, 12M and 12Y corresponding to respective ink colors are disposed in the order, black (K), cyan (C), magenta (M) and yellow (Y), from the upstream side, following the direction of conveyance of the recording paper 16. A color print can be formed on the recording paper 16 by ejecting the inks from the heads 12K, 12C, 12M, and 12Y, respectively, onto the recording paper 16 while the recording paper 16 is conveyed.

The print determination unit 24 comprises a line sensor for capturing images of the droplet ejection results of the print unit 12. It is possible to check for nozzle blockages, and other ejection defects, on the basis of the droplet ejection images read in by this line sensor.

Below, the description is made with reference to FIG. 1. An after drying unit 42 is provided at a downstream stage from the print detection unit 24. The after drying unit 42 is a device for drying the printed image surface, and it may comprise, for example, a heating fan. It is preferable to avoid contact with the printed surface until the printed ink dries, and therefore a device that blows heated air onto the printed surface is preferable.

A heating and pressurizing unit 44 is provided at a stage following the after drying unit 42. The heating and pressurizing unit 44 is a device for controlling the luster of the image surface. The image surface of the recording paper 16 is pressurized by a pressurizing roller 45 having a prescribed undulating shape on the surface thereof, while the recording paper 16 is heated by means of the heating and pressurizing unit 44. Accordingly, the undulating shape on the surface of the pressurization roller 45 is transferred to the image surface of the recording paper 16.

The printed matter thus generated is cut to a prescribed size by the cutter 48, and is then output from the paper output unit 26. Desirably, the actual image that is to be printed (the printed copy of the desired image), and test prints, are output separately. In the inkjet recording apparatus 10, a sorting device (not shown) is provided for switching the outputting pathway in order to sort the printed matter with the target print and the printed matter with the test print, and to send them to paper output units 26A and 26B, respectively. If the main image and the test print are formed simultaneously in a parallel fashion, on a large piece of printing paper, then the portion corresponding to the test print is cut off by means of the cutter (cutter for mask) 48.

Figure 3:
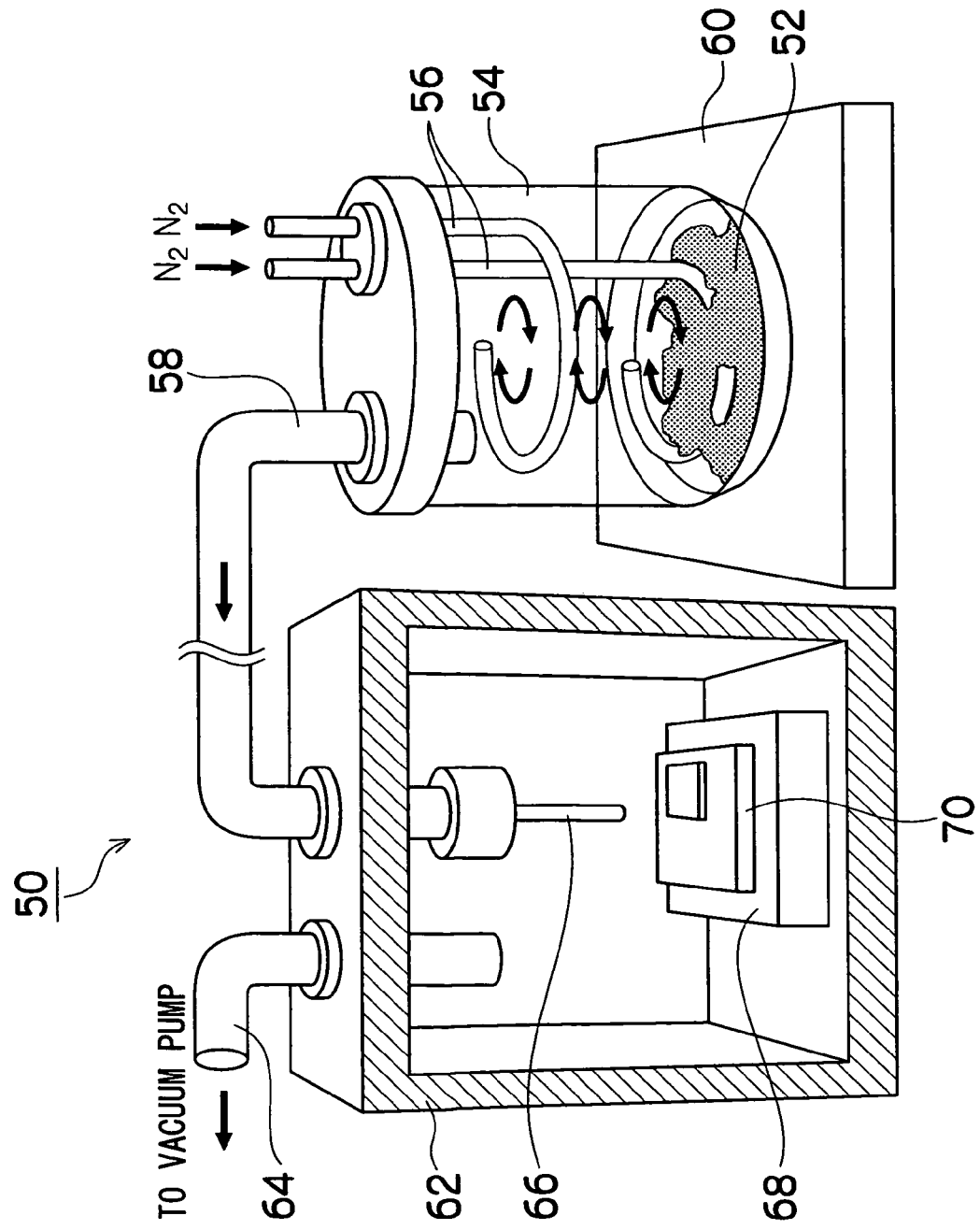
FIG. 3 is a schematic drawing showing a film formation apparatus using an aerosol deposition method.

Next, a film formation apparatus as used in the manufacture of a liquid ejection head according to an embodiment of the present invention is described. FIG. 3 is a schematic drawing showing a film formation apparatus based on an aerosol deposition (AD) method. The film formation apparatus 50 shown in FIG. 3 forms a film on a substrate made of silicon (Si), for example, by means of the aerosol deposition method.

The film formation apparatus 50 has an aerosol-generating chamber 54 in which powder 52 of raw material (piezoelectric material) is accommodated. Here, the "aerosol" stands for fine particles of a solid or liquid dispersed in a gas. The aerosol-generating chamber 54 is provided with carrier gas input sections 56, an aerosol output section 58, and a vibrating unit 60. Aerosol is generated by introducing a gas, such as nitrogen gas ($N_2$), via the carrier gas input sections 56, then blowing and lifting the raw material powder 52 that is present in the aerosol-generating chamber 54. In this case, by applying a vibration to the aerosol-generating chamber 54 by means of the vibrating unit 60, the raw material powder 52 is churned up and the aerosol is generated efficiently. The aerosol thereby generated is channeled through the aerosol output section 58 to a film formation chamber 62.

The film formation chamber 62 is provided with an evacuate tube 64, a nozzle 66, and a movable stage 68. The evacuate tube 64 is connected to a vacuum pump (not shown) to evacuate the gas from the film formation chamber 62. The aerosol, which is generated in the aerosol generating chamber 54 and is conducted to the film formation chamber 62 via the aerosol output section 58, is sprayed from the nozzle 66 onto a substrate 70. In this way, the raw material powder 52 collides with the substrate 70 and is thereby deposited thereon. The substrate 70 is mounted on the movable stage 68, which is capable of the three-dimensional movement, and hence the relative positions of the substrate 70 and the nozzle 66 can be adjusted by controlling the movable stage 68.

Next, a method for manufacturing the liquid ejection head according to an embodiment of the present invention is described with reference to FIGS. 4A to 4G. FIGS. 4A to 4G are diagrams showing a method of manufacturing a liquid ejection head according to a first embodiment of the present invention. FIGS. 4A to 4G are cross-sectional diagrams of respective steps of a process of manufacturing a liquid ejection head. In actual practice, a plurality of liquid ejection heads are made from one substrate, but only one liquid ejection head is shown in FIGS. 4A to 4G.

Firstly, a substrate 80 constituting pressure chamber partitions of the pressure chambers in which ink is accommodated is formed. The substrate 80 may be made of a silicon (Si) wafer, for example. The substrate 80 may have a thickness of 200 μm and a diameter of 6 inches, for example. A diaphragm 82 is formed on the substrate 80 as shown in FIG. 4A. The diaphragm 82 is formed by depositing a film of stainless steel, for example. The surface of the diaphragm 82 is polished in such a manner that the surface roughness (Ra) is not more than approximately 50 nm, for example. The thickness of the diaphragm 82 after polishing is, for example, 15 μm. The diaphragm 82 may be formed by bonding a stainless steel plate to the substrate 80 and then etching this stainless steel plate.

Desirably, materials having heat resistant properties and corrosion resistant properties are used for the substrate 80 and the diaphragm 82. Here, the material having heat resistance is a material which does not produce deformation, denaturalization or compositional change in the subsequent annealing step. Furthermore, the material having corrosion resistance is a material which does not dissolve or become denaturalized, even if the liquid (ink) used in the liquid ejection head has corrosive properties. Materials having heat resistant and corrosion resistant properties of this kind include, for example, silicon (Si), silica ($SiO_2$), alumina ($Al_2O_3$), zirconia ($ZrO_2$), silicon carbide (SiC), mullite ($Al_6Si_2O_{13}$), magnesia (MgO), aluminum nitride (AlN), silicon nitride ($SiN_4$), silicon aluminum oxynitride (SiAlON), chromium nitride ($Cr_2N$), zirconium nitride (ZrN), tantalum nitride (TaN), tantalum carbide (TaC), tantalum silicide ($TaSi_2$), zirconium silicide ($ZrSi_2$), zirconium boride ($ZrB_2$), stainless steel (SUS430), and the like.

Next, as shown in FIG. 4B, a lower electrode 84 is formed on the diaphragm 82. The lower electrode 84 includes a platinum (Pt) layer of approximately 200 nm and/or a titanium (Ti) layer of approximately 50 nm, for example, and it may be formed by sputtering.

Then, as shown in FIG. 4C, a film of hardness control material is deposited on the lower electrode 84, in order to form a constraint force buffering layer 86. The constraint force buffering layer 86 is made of a polyurethane-based shape memory polymer, which is applied by spin coating. The thickness of the shape memory polymer is controlled to a range of several nanometers (nm) to several micrometers (μm), by adjusting the revolution speed (number of revolutions) of the spin coating and the viscosity of the shape memory polymer. A piezoelectric film 88 is formed on the constraint force buffering layer 86 as shown in FIG. 4D. The piezoelectric film 88 is made of, for example, lead zirconate titanate ($Pb(Zr,Ti)O_3$ (PZT)), which is deposited to a thickness of 10 μm at room temperature by the aerosol deposition method.

FIG. 5 is a graph showing a schematic view of the temperature dependent properties of the elastic modulus of the shape memory polymer. As shown in FIG. 5, with increase in the temperature, the shape memory polymer changes sequentially from a glass region having a high elastic modulus (in other words, a high hardness), to a glass transition region, a rubber region of low elastic modulus and a fluid region.

As stated above, during film formation by the aerosol deposition method, the powder of the starting material (PZT) accelerated to high speed collides with the surface of the constraint force buffering layer 86 (corresponding to the substrate 70 in FIG. 3), or the piezoelectric film 88 deposited previously on the constraint force buffering layer 86, and the like. When the powder collides, displacement of the crystal lattices may occur at the surface of the PZT powder and/or the constraint force buffering layer 86, or these surfaces may be broken up, active surfaces may appear and these active surfaces may bond together. Therefore, when the film is deposited by the aerosol deposition method, it is necessary for the substrate to have a certain level of strength.

Shape memory polymers can generally be synthesized with a glass transition temperature Tg in the range of approximately −50° C. to approximately 150° C. In the present embodiment, a polyurethane-based shape memory polymer having a glass transition temperature Tg of approximately 0° C. is used as the hardness control material. The temperature during the film deposition of the piezoelectric film 88 is made equal to or less than the glass transition temperature Tg of the polyurethane-based shape memory polymer used in the constraint force buffering layer 86. More specifically, the film formation chamber 62 is cooled by using a cooling mechanism with liquid nitrogen, or the like, thereby setting the temperature during the film formation to approximately −20° C. Consequently, the state of the constraint force buffering layer 86 during the film formation is in the glass region, and it is possible to form the film in a state where the film formation surface of the constraint force buffering layer 86 has high hardness (a state where the Vickers hardness is approximately 400 Hv or above).

On the other hand, the temperature during driving of the liquid ejection head is generally between approximately 15° C. and approximately 60° C. (and at highest, approximately 100° C.). Therefore, the state of the shape memory polymer of the constraint force buffering layer 86 is in the rubber region with low elastic modulus during driving. Therefore, in the present embodiment, the constraint force buffering layer 86 serves as an absorbing layer (a buffering layer) which reduces the constraint force of the substrate constraint, in which the diaphragm 82 and the lower electrode 84 act to restrict the piezoelectric film 88 along the film surface direction. Therefore, it is possible to improve the d31 properties of the piezoelectric film 88.

Desirably, when the liquid ejection head is driven, the state of the constraint force buffering layer 86 does not reach the fluid region. Hence, desirably, the temperature forming a boundary between the rubber region and the fluid region in FIG. 5 is between approximately 60° C. and approximately 100° C. or above.

Returning to the description with reference to FIG. 4D, a calcining process is subsequently carried out on the piezoelectric film 88 by laser annealing or electromagnetic heating. Thereby, the properties of the piezoelectric film 88 are improved, and residual stress is removed from the piezoelectric film 88. When the laser annealing or the electromagnetic heating is carried out, the light or electromagnetic wave irradiation conditions are selected appropriately, and a short-pulse non-continuous drive method, or the like, is used. Consequently, it is possible to heat the piezoelectric film 88 selectively, in such a manner that the heat is not transmitted to the diaphragm 82 and the constraint force buffering layer 86, and the like. For example, if the laser annealing is used, then by using an ultra-short pulse laser such as a femtosecond laser, it is possible to suppress the generation of heat to a level that does not exceed the heat resistant temperature of the polyurethane-based shape memory polymer (e.g., several hundred degrees Centigrade (° C.)).

An upper electrode 90 is formed on this piezoelectric film 88, as shown in FIG. 4E. This upper electrode 90 is made of platinum (Pt) deposited by a lift-off method, for example. The thickness of the upper electrode 90 is 200 nm, for example.

Subsequently, a chromium (Cr) film (not shown) is deposited on the lower (in the diagram) surface of the substrate 80, and this chromium film (not shown) is patterned. The substrate 80 is etched by a reactive ion etching (RIE) method, taking the chromium film as a mask and using Freon™ gas (e.g., tetrafluorocarbon ($CF_4$)). This etching is stopped by the lower (in the diagram) surface of the diaphragm 82, and hence a flat etching surface is exposed. In other words, since Freon™ gas has a high etching selective ratio in respect of the material of the substrate 80 (silicon) and the material of the diaphragm 82 (stainless steel), then it is possible to carry out highly accurate etching. The perforated sections in the substrate 80 by the etching process form the pressure chambers 92, and the remaining sections in the substrate 80 form the pressure chamber partition walls 80A. Thus, the piezoelectric actuator comprising the diaphragm 82, the lower electrode 84, the constraint force buffering layer 86, the piezoelectric film 88 and the upper electrode 90 is formed.

For the etching method for forming the pressure chambers 92 and the pressure chamber partition walls 80A, apart from the above-described RIE dry etching method, it is also possible to use wet etching, for example. If dry etching is used, then desirably, the materials of the substrate 80 and the diaphragm 82, and the etching gas, are selected in such a manner that the etching selective ratio between the material of the substrate 80 and the material of the diaphragm 82 is 2:1 (and more desirably, 5:1). Furthermore, if wet etching is used, then desirably, the materials of the substrate 80 and the diaphragm 82, and the etching liquid, are selected in such a manner that the etching selective ratio is 5:1 (and more desirably, 10:1).

Finally, as shown in FIG. 4G, a nozzle plate 94 having nozzles 94A is attached to the lower (in the diagram) surface of the pressure chamber partitions 90A by means of an adhesive, thereby manufacturing a liquid ejection head 96.

In the liquid ejection head 96 manufactured as described above, a poling process is carried out to align the directions of the polarization axes of the spontaneous polarization of the crystal particles constituting the piezoelectric film 88, by applying a direct current (DC) electric field of approximately 30 kV/mm between the lower electrode 84 and the upper electrode 90. It is thereby possible to achieve displacement driving of the liquid ejection head 96. As the result of a displacement driving experiment, whereas the piezoelectric constant d31 of a liquid ejection head 96 that is not provided with a constraint force buffering layer 86 was approximately 50 pm/V, the piezoelectric constant d31 of a liquid ejection head 96 having the constraint force buffering layer 86 was approximately 80 pm/V. Consequently, it was confirmed that the d31 properties are improved in the piezoelectric actuator according to the present embodiment of the present invention, and the liquid ejection head 96 comprising same.

Next, a further embodiment of the method of manufacturing a liquid ejection head is described with reference to FIGS. 6A to 6F. FIGS. 6A to 6F are diagrams showing the method of manufacturing a liquid ejection head according to a second embodiment of the present invention. FIGS. 6A to 6F are cross-sectional diagrams of respective steps of the process of manufacturing a liquid ejection head. In the following description, parts of the composition which are similar to those shown in FIGS. 4A to 4G are denoted with the same reference numerals and description thereof is omitted.

Firstly, a substrate 80 constituting the pressure chamber partitions of the pressure chambers in which ink is accommodated is formed. The substrate 80 is made of a silicon (Si) wafer, for example, and has a thickness of 200 μm and a diameter of 6 inches, for example. As shown in FIG. 6A, a diaphragm 82' is formed by applying a hardness control material on the substrate 80 by spin coating. Desirably, materials having heat resistant properties and corrosion resistant properties are used for the substrate 80 and the diaphragm 82'.

Next, as shown in FIG. 6B, a lower electrode 84 is formed on the diaphragm 82'. The lower electrode 84 includes a platinum (Pt) layer of approximately 200 nm and/or a titanium (Ti) layer of approximately 50 nm, for example, and it may be formed by sputtering. The subsequent manufacturing steps from FIG. 6C to FIG. 6F are similar respectively to the steps in FIG. 4D to FIG. 4G, and description thereof is omitted here.

According to the present embodiment, since the diaphragm 82' is formed of the hardness control material, then it is possible to reduce the constraint force of the diaphragm 82' during driving, which constrains the piezoelectric film 88 along the film surface direction. Therefore, according to the piezoelectric actuator in the present embodiment and a liquid ejection head 96' comprising same, it is possible to improve the d31 properties, similarly to the first embodiment described above.

In the respective embodiments described above, the polyurethane-type shape memory polymer is used as the hardness control material, but the present invention is not limited to this. For example, it is also possible to use any material of a kind that has low hardness (the Vickers hardness of approximately 400 Hv or lower) during driving (at approximately 15° C. to approximately 100° C.) and has high hardness (the Vickers hardness of approximately 400 Hv or above) during the formation of the piezoelectric film 88. In other words, since the temperature during formation of the piezoelectric film 88 can be set as desired, it is possible to use for the hardness control material, any material whose hardness can increase at a temperature other than the temperature during driving (from approximately 15° C. to approximately 100° C.).

Moreover, it is also possible to control the hardness of the constraint force buffering layer 86 or the diaphragm 82' by providing a temperature adjusting device which adjusts the temperature of the liquid ejection head, and controlling the temperature of the head suitably during driving.

For the hardness control material, it is also possible to use a material whose hardness can be controlled by the irradiation of light or electromagnetic wave, the application of an electric field, or a chemical reaction. In this case, when the liquid ejection head (96 or 96') is installed in the inkjet recording apparatus 10, or the like, the hardness of the constraint force buffering layer 86 or the diaphragm 82' is lowered previously by means of the irradiation of light or electromagnetic wave, the application of an electric field, or the chemical reaction. Thereby, similarly to the embodiments described above, it is possible to improve the d31 properties.

Further, the present invention may also be applied to cases where a method other than the above-described aerosol deposition method, such as a gas deposition method or another deposition method, is used as a method of forming the piezoelectric film 88.

Furthermore, the liquid ejection head according to the present invention may be applied to an image forming head which forms images by ejecting treatment liquid or water onto a recording medium, or a liquid ejection head for forming an image recording medium by ejecting an application liquid (coating liquid) onto a substrate.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric actuator, comprising:
   a substrate;
   a constraint force buffering layer which is formed on the substrate and made of a hardness control material having low hardness at an operating temperature, said operating temperature occurring during driving of the piezoelectric actuator, said constraint force buffering layer having a higher hardness at a temperature lower than said operating temperature; and
   a piezoelectric element which is formed on the constraint force buffering layer, wherein the hardness control material is a shape memory polymer of which a glass transition temperature is not greater than a temperature during driving of the piezoelectric actuator.

2. The piezo electric actuator as defined in claim 1, wherein Vickers hardness of the hardness control material is not greater than approximately 400 Hv.

3. The piezoelectric actuator as defined in claim 1, wherein the piezoelectric element is formed by a deposition method.

4. The piezoelectric actuator as defined in claim 3, wherein the hardness of the hardness control material, at a temperature during formation of the piezoelectric element, is higher than the hardness at the operating temperature, wherein the temperature during the formation of the piezoelectric element is lower than the operating temperature.

5. The piezoelectric actuator as defined in claim 3, wherein Vickers hardness of the hardness control material under the temperature condition during formation of the piezoelectric element is not lower than approximately 400 Hv.

6. The piezoelectric actuator as defined in claim 1, wherein the hardness control material is at least one of a resin material, a shape memory polymer and a polyurethane-type shape memory polymer.

7. A liquid ejection head, comprising the piezoelectric actuator as defined in claim 1.

8. A piezoelectric actuator, comprising: a substrate which is made of a hardness control material having low hardness at an operating temperature, said operating temperature occurring during driving of the piezoelectric actuator, said substrate having a higher hardness at a temperature lower than said operating temperature; and a piezoelectric element which is formed on the substrate;
wherein the hardness control material is a shape memory polymer of which a glass transition temperature is not greater than a temperature during driving of the piezoelectric actuator.

9. The piezoelectric actuator as defined in claim 8, wherein Vickers hardness of the hardness control material is not greater than approximately 400 Hv.

10. The piezoelectric actuator as defined in claim 8, wherein the piezoelectric element is formed by a deposition method.

11. The piezoelectric actuator as defined in claim 10, wherein the hardness of the hardness control material, at a temperature during formation of the piezoelectric element, is higher than the hardness at the operating temperature, wherein the temperature during the formation of the piezoelectric element is lower than the operating temperature.

12. The piezo electric actuator as defined in claim 10, wherein Vickers hardness of the hardness control material under the temperature condition during formation of the piezoelectric element is not lower than approximately 400 Hv.

13. The piezoelectric actuator as defined in claim 8, wherein the hardness control material is at least one of a resin material, a shape memory polymer and a polyurethane-type shape memory polymer.

14. A liquid ejection head, comprising the piezoelectric actuator as defined in claim 8.

15. The piezoelectric actuator as defined in claim 1, wherein said piezoelectric element is formed directly on the constraint force buffering layer.

16. The piezoelectric actuator as defined in claim 8, wherein said piezoelectric element is formed directly on the substrate.

17. The piezoelectric actuator as defined in claim 1, wherein said hardness control material is a material having a glass transition temperature of approximately 0° C.

* * * * *